US006503379B1

(12) United States Patent
Kidd et al.

(10) Patent No.: US 6,503,379 B1
(45) Date of Patent: Jan. 7, 2003

(54) MOBILE PLATING SYSTEM AND METHOD

(75) Inventors: Jerry D. Kidd, Granbury; Craig D. Harrington, Cleburne; Daniel N. Hopkins, Fort Worth, all of TX (US)

(73) Assignee: Basic Research, Inc., Dallas, TX (US)

( * ) Notice: Subject to any disclaimer, the term of this patent is extended or adjusted under 35 U.S.C. 154(b) by 0 days.

(21) Appl. No.: 09/576,640

(22) Filed: May 22, 2000

(51) Int. Cl.[7] ........................... C23C 14/34; C23C 16/00

(52) U.S. Cl. ............................. 204/298.05; 204/298.23; 204/298.25; 204/298.27; 204/298.28; 204/298.35; 118/719; 118/723 VE; 118/723 EB; 118/723 E; 118/729; 118/730; 414/253; 414/288; 414/342; 414/345; 414/373; 414/390; 414/391; 414/399; 414/591; 414/592; 414/217; 414/221; 414/227; 414/233; 414/234; 414/241

(58) Field of Search ..................... 204/298.05, 298.23, 204/298.25, 298.27, 298.28, 298.35; 118/719, 723 VE, 723 EB, 723 E, 729, 730; 414/217, 221, 227, 233, 234, 241, 253, 288, 342, 345, 373, 390, 391, 399, 591, 592

(56) References Cited

U.S. PATENT DOCUMENTS

| 3,329,601 A | 7/1967 | Mattox ........................ 204/298 |
| 3,719,052 A | 3/1973 | White ........................... 62/3.2 |

(List continued on next page.)

FOREIGN PATENT DOCUMENTS

| DE | 2118082 | 10/1972 |
| DE | 44-18-161 A1 | 11/1995 |

(List continued on next page.)

OTHER PUBLICATIONS

Edwin S. Bartlett, Harry A. Beale, *Oxidation Protective Coatings for Superalloys and Refractory Metals*, vol. 5, Surface Cleaning, Finishing and Coating, Metals Handbook, 9th Ed., 1982, pp. 375–426, American Society for Metals, Metals Park, Ohio, U.S.A.

(List continued on next page.)

*Primary Examiner*—Rodney G. McDonald
(74) *Attorney, Agent, or Firm*—Hunton & Williams

(57) ABSTRACT

An exemplary mobile plating system and method are provided for performing a plating process using virtually any known or available deposition technology for coating or plating. The mobile plating system may include a vacuum chamber positioned in a mobile storage volume, an external vacuum pump, and a control module to control the operation of some or all of the operations of the external vacuum pump. The external vacuum pump is positioned in the mobile storage volume when the mobile plating system is in transit, and is positioned external to the mobile storage volume when the mobile plating system is stationary and in operation. The external vacuum pump may be mounted on a skid, and, in operation, the external vacuum pump couples with the vacuum chamber to assist with producing a desired pressure in the vacuum chamber. The external vacuum pump couples with the vacuum chamber using a flexible piping segment to reduce and/or eliminate any mechanical vibrations within the vacuum chamber and within the mobile storage volume due to the operation of the external vacuum pump.

An exemplary method for using a mobile plating system is provided that includes locating the mobile plating system at a desired location for plating, positioning an external vacuum pump from an interior position of a mobile storage volume of the mobile plasma plating system to an exterior position, and coupling the external vacuum pump to a vacuum chamber within the mobile storage volume of the mobile plasma plating system using a flexible piping segment.

32 Claims, 6 Drawing Sheets

U.S. PATENT DOCUMENTS

| | | | |
|---|---|---|---|
| 3,756,847 A | 9/1973 | Leibowitz et al. | 117/93.3 |
| 3,857,682 A | 12/1974 | White | 428/610 |
| 3,961,103 A | 6/1976 | Aisenberg | 427/39 |
| 4,016,389 A | 4/1977 | White | 219/634 |
| 4,039,416 A | 8/1977 | White | 427/523 |
| 4,054,426 A | 10/1977 | White | 51/309 |
| 4,082,636 A | 4/1978 | Takagi | 427/524 |
| 4,126,521 A | 11/1978 | Coffin | 204/15 |
| 4,137,370 A | 1/1979 | Fujishiro et al. | 428/660 |
| 4,213,844 A | 7/1980 | Morimoto et al. | 204/298.05 |
| RE30,401 E | 9/1980 | White | 427/524 |
| 4,282,597 A | 8/1981 | Yenawine et al. | 368/280 |
| 4,293,171 A | 10/1981 | Kakumoto et al. | 384/492 |
| 4,310,614 A | 1/1982 | Connell et al. | 430/271 |
| 4,342,631 A | 8/1982 | White et al. | 427/524 |
| 4,407,712 A | 10/1983 | Henshaw et al. | 204/298.03 |
| 4,420,386 A | 12/1983 | White | 427/526 |
| 4,461,689 A | 7/1984 | Diepers | 427/530 |
| 4,468,309 A | 8/1984 | White | 427/528 |
| 4,480,010 A | 10/1984 | Sasanuma et al. | 428/457 |
| 4,530,885 A | 7/1985 | Restall | 428/670 |
| 4,603,057 A | 7/1986 | Ueno et al. | 427/429 |
| 4,667,620 A | 5/1987 | White | 118/50.1 |
| 4,673,586 A | 6/1987 | White | 427/562 |
| 4,725,345 A | 2/1988 | Sakamoto et al. | 204/192.31 |
| 4,826,365 A | 5/1989 | White | 408/144 |
| 4,852,516 A * | 8/1989 | Rubin et al. | 118/719 |
| 4,863,581 A | 9/1989 | Inokuti et al. | 600/18 |
| 4,885,069 A | 12/1989 | Coad et al. | 204/192.12 |
| 4,938,859 A | 7/1990 | Ide et al. | 118/723 VE |
| 4,956,858 A | 9/1990 | Upadhya | 378/133 |
| 4,990,233 A | 2/1991 | Hahn | 427/529 |
| 5,061,512 A | 10/1991 | Upadhya | 427/531 |
| 5,076,205 A * | 12/1991 | Vowles et al. | 118/719 |
| 5,078,847 A | 1/1992 | Grosman et al. | 427/523 |
| 5,085,499 A | 2/1992 | Griffin et al. | 356/311 |
| 5,208,079 A | 5/1993 | Fukushima et al. | 427/527 |
| 5,227,203 A | 7/1993 | Kibe et al. | 427/523 |
| 5,252,365 A | 10/1993 | White | 427/525 |
| 5,380,420 A | 1/1995 | Tsuji | 204/298.41 |
| 5,403,419 A | 4/1995 | Yoshikawa et al. | 156/151 |
| 5,409,762 A | 4/1995 | Ozaki et al. | 428/216 |
| 5,514,260 A | 5/1996 | Seo | 204/298.26 |
| 5,556,519 A | 9/1996 | Teer | 204/192.12 |
| 5,595,814 A | 1/1997 | Yamagata et al. | 428/216 |
| 5,730,847 A * | 3/1998 | Hanaguri et al. | 204/298.41 |
| 5,744,811 A * | 4/1998 | Schonberg et al. | 250/492.3 |
| 5,798,496 A | 8/1998 | Eckhoff | 219/121.36 |
| 5,889,587 A | 3/1999 | D'Silva et al. | 356/316 |
| 6,090,157 A | 7/2000 | Traut et al. | 8/149.3 |
| 6,153,270 A | 11/2000 | Russman et al. | 427/522 |
| 6,156,392 A | 12/2000 | Duffy et al. | 427/475 |

FOREIGN PATENT DOCUMENTS

| | | | |
|---|---|---|---|
| EP | 0-374-060 A1 | 6/1990 | B23K/15/00 |
| EP | 0-492 511 A2 | 7/1992 | H01J/37/16 |
| EP | 0-653-252 A1 | 5/1995 | B09C/1/06 |
| WO | WO-01/90436 A2 | 11/2001 | C23C/14/00 |
| WO | WO-01/90437 A2 | 11/2001 | C23C/14/00 |

OTHER PUBLICATIONS

James M. E. Harper, et al., *Modification of Thin Film Properties by Ion Bombardment During Deposition*, Ion Bombardment Modification of Surfaces Fundamentals and Applications, Ch. 4, 1984, p. 132, Elsevier Science Publishers, B.V., Amsterdam, The Netherlands.

Donald M. Mattox, *Microstructure and Properties*, Handbook of Deposition Technologies for Films and Coatings, Sciences, Technology and Applications, 2d Ed. 1994, p. 354, Noyes Publications, Park Ridge, New Jersey, U.S.A.

Daniel N. Hopkins, P.E., PhD., Craig D. Harrington, P.E., D.Eng., *MagIon: Reduce Galling, Control Friction, Save Money, a Technology Assessment*, 1997, pp. 1–10.

*MagIon*, Energy Digest Issue Three 1997, pp. 18–19 Westinghouse Electric Company Energy Systems, Pittsburgh, PA.

*Metals Seals*, Nuclear News, Nov. 1997, p. 88, American Nuclear Society, La Grange Park, Illinois..

Jerry Kidd, Craig Harrinton, Dan Hopkins, *Magpon: The Metallurgical Anti–Seize Lubricant—Summary*, pp. 1–13, Glen Rose, Texas, entry in 1998 NEI Top Industry Practice Awards, Mar. 20, 1998.

Daniel N. Hopkins, Craig D. Harrington, *Use of Engineered Surfaces to reduce Galling Control Friction & Save Money*, Glen Rose; Texas, presented at 1998, ASME Pressure Vessels and Piping Conference.

Bill R. Black, Daniel N. Hopkins, Craig D. Harrington, *Engineered Surfaces Reduce Maintenance Costs*, Glen Rose, Texas, submitted for publication in a fall 1998 issue of Nuclear Plant Journal.

Daniel N. Hopkins, P.E., Ph.D., Craig D. Harrington, P.E., D. Eng., *MagIon: Engineered Surfaces to Control Galling and Reduce Maintenance Costs*, Glen Rose, Texas, published in the Proceedings of 1998 60th American Power Conference.

TU Electric pamphlet entitled *Mitigate Galling Conrol Friction Reduce Cost with . . . MagIon*, Westinghouse Electric Company, Madison, PA, Nov. 1998.

Bill R. Black, Daniel N. Hopkins, Craig D. Harrington, *Vacuum Coating Mitigates Galling, Controls Friction*, Power, Mar./Apr. 1999, pp. 70–72.

Daniel N. Hopkins, Craig D. Harrington, Bill R. Black, *Reduce Maintenance Costs by Using Engineered Surfaces to Control Friction and Galling*, Wear 225–229 (1999), pp. 27–37, Elsevier Science S.A.

R. R. Dulaney, C. M. Pezze, *MagIon Recommendations (Technical)*, Jul. 30, 1999 Doc. No. EDRE–AEE–99–190.

Pending U.S. Patent Application Ser. No. 08/573,870; inventor, White (et al?), filing date unknown.

*Instructions for Low–Voltage Power Circuit Breakers, Types DS and DSL*, pp. 1–82, I.B. 33–790–1F, Effective Oct., 1983, Westinghouse Electric Corporation, Switchgear Division, East Pittsburgh, PA.

Aronson, A.J., Chen D. and Class, W.H., *Preparation of Titanium Nitride by a Pulsed D.C. Magnetron Reactive Deposition Technique Using the Moving Mode of Deposition* (Thin Solid Films), 1980, pp. 535–540, 72, Elsevier Sequoia S.A., Lousanne–Printed in the Netherlands.

Mattox, D.M., *Fundamentals of Ion Plating* (J. Vac. Sci. Technol,)Jan./Feb. 1973, pp. 47–52, vol. 10, No. 1, Sandia Laboratories, Albuquerque, N.M.

Geis, Charles G. and Fairful, David Jr., *Maintenance Program Manual*, MPM–DS *Breaker for Westinghouse Type DS Circuit Breakers and Associated Switchgear*, Revision O Dated Jun. 1, 1993, *Westinghouse Electric Corporation, Nuclear Services Division*, Pittsburgh, PA.

* cited by examiner

MOBILE PLATING SYSTEM AND METHOD

RELATED APPLICATIONS

This application is related to U.S. patent application Ser. No. 09/427,775 entitled System and Method for Plasma Plating, filed Oct. 26, 1999 pending, and named Jerry D. Kidd, Craig D. Harrington, and Daniel N. Hopkins as joint inventors, and U.S. patent application Ser. No. 09/578,166 pending entitled Configurable Vacuum System and Method, filed on May 22, 2000, and named Jerry D. Kidd, Craig D. Harrington, and Daniel N. Hopkins as joint inventors.

TECHNICAL FIELD OF THE INVENTION

This invention relates in general to the field of mobile systems and deposition technology for plating and coating materials and more particularly to a mobile plating system and method.

BACKGROUND OF THE INVENTION

Deposition technologies for coating and plating materials and developing engineered surfaces may include any of a variety of deposition technologies. These deposition technologies may include, for example, vacuum deposition or physical vapor deposition ("PVD"), chemical vapor deposition ("CVD"), sputtering, and ion plating. Generally, these deposition technologies may involve the steps of: (a) preparing and cleaning the surface of the target or substrate; (b) establishing a vacuum or desired pressure level at designated operating parameters; and (c) performing the deposition. Such deposition technologies involve large, expensive, and complex systems, equipment, and machinery.

For example, many such deposition technologies require an expensive, bulky, and complex vacuum system to establish and maintain a vacuum at a designated operating pressure. Such a vacuum system may include, generally, a vacuum chamber, mechanical vacuum pumps, which may be used as roughing and foreline vacuum pumps, a secondary vacuum pump, such as a diffusion pump, a cryo pump, and/or a turbo molecular pump, and complex pressure gauges, such as an ion vacuum gauge. These vacuum systems often require complex piping and plumbing configurations that must be free of leaks so that the precise and desired operating pressures and parameters can be maintained and followed. Such complex piping and plumbing is particularly subject to leakage at turns in the pipes or joints where pipes interface due to interface problems and mechanical vibrations caused by the operation of the vacuum pumps.

Some or all of the vacuum pumps, such as a diffusion pump, may also require a large and complex cooling system that, often, uses hundreds or thousands of gallons of water that must be cooled and circulated prior and during the operation of the vacuum pump. This may require a large and bulky water cooling system that includes a large water storage tank and a refrigeration system to cool the water in the large storage tank.

Because deposition technologies involve such large, expensive, and complex systems, equipment, and machinery, such systems must, generally, be permanently installed at a location. When large parts or components, such as those weighing hundreds or thousands of pounds, or when bulky or hard to ship parts or components need to be coated or plated using one of the deposition technologies, about the only option is to permanently install such a system at or near such large or bulky components. This allows such large and bulky components to be moved only a short distance to be coated or plated.

Unfortunately, because this is such an expensive option, it is often cost prohibitive. The high expenses include, not only the cost in procuring the real estate and equipment, and in setting up such complex systems, but in maintaining the equipment and in hiring and employing personnel with the special expertise needed to successfully operate and maintain such systems. Problems also exist in designing a deposition technology system. All such systems require custom design work to meet the particular needs and circumstances of the installation. Turnkey deposition technology systems simply do not exist. As has been illustrated, the design, installation, operation, and maintenance of deposition technology systems are complex and expensive, and, as a result, the coating or plating of large and bulky components using deposition technologies is often not available, even though such large and bulky components may greatly benefit from the significant advantages offered by such deposition technologies.

In some cases, the availability of certain components or parts is so critical that, from either a safety and/or a financial standpoint, the risk of a shipping delay or lost shipment, no matter how small, is too great a risk to take, even if significant advantages could be gained through coating or plating. For example, a reactor vessel head stud that is used in a nuclear power plant is so crucial and unique, that the risk of a shipping delay or lost shipment during a plant outage, such as, for example, during a fuel reload at a nuclear power plant that occurs every couple of years or so, is too great to take. For example, for every day that a nuclear plant is kept off line because of a delay, hundreds of thousands or even millions of dollars may be lost. Thus, certain components or parts are so crucial that they would never be shipped to another location for plating or coating using deposition technologies, in spite of all of the significant advantages that may be realized through such deposition technologies.

SUMMARY OF THE INVENTION

From the foregoing it may be appreciated that a need has arisen for a mobile plating system and method that allows a plating system, including all associated sophisticated equipment and system to be conveniently provided at a user's location or virtually any desired location. In accordance with the present invention, a mobile plating system and method are provided that substantially eliminate one or more of the disadvantages and problems outlined above.

According to an aspect of the present invention, a mobile plating system for performing a plating process is provided. The mobile plating system includes a vacuum chamber positioned in a mobile storage volume, an external vacuum pump, and a control module to control the operation of some or all of the operations of the external vacuum pump. The external vacuum pump is positioned in the mobile storage volume when the mobile plating system is in transit, and is positioned external to the mobile storage volume when the mobile plating system is stationary and in operation. The external vacuum pump may be mounted on a skid, and, in operation, the external vacuum pump couples with the vacuum chamber to assist with producing a desired pressure in the vacuum chamber. The external vacuum pump couples with the vacuum chamber using a flexible piping segment to reduce and/or eliminate any mechanical vibrations within the vacuum chamber and within the mobile storage volume due to the operation of the external vacuum pump.

According to another aspect of the present invention, a method for using a mobile plating system is provided that includes locating the mobile plating system at a desired location for plating, positioning an external vacuum pump from an interior position of a mobile storage volume of the mobile plasma plating system to an exterior position, and coupling the external vacuum pump to a vacuum chamber within the mobile storage volume of the mobile plasma plating system using a flexible piping segment. The method may also include placing a substrate and a depositant within the vacuum chamber, establishing a desired pressure in the vacuum chamber using the external vacuum pump, and plating the substrate with the depositant.

The present invention provides a profusion of technical advantages that include the capability to locate sophisticated deposition technologies, systems, equipment, and machinery for coating and plating at virtually any desired location, which substantially increases the availability of such important technology.

Another technical advantage of the present invention includes the capability to make coating or plating from deposition technologies available for large and bulky components and parts that cannot be shipped or cannot be easily shipped without having to incur the significant expense of designing, operating, and maintaining a complex system using deposition technology.

Yet another technical advantage of the present invention includes the capability to coat or plate mission critical components, such as reactor vessel head studs used at nuclear power plants. Because the present invention allows deposition technologies to be brought to the customer, unacceptable risks due to possible shipping delays or lost shipments are eliminated.

Another technical advantage of the present invention includes the capability to reduce or eliminate shipping costs, even for smaller components and parts or non-mission critical parts, and eliminate the need to incur the substantial expense and cost of designing, operating, and maintaining a complex system using deposition technology. This significantly reduces overall costs.

Still yet another technical advantage of the present invention includes the capability to operate noisy mechanical vacuum pumps, such as mechanical roughing and foreline pumps, external to the mobile chamber resulting in reduced mechanical vibrations and increased operational reliability of the mobile plating system.

Still yet another technical advantage includes the capability to use sophisticated cooling system, such as a water cooling system, within a mobile storage volume of the mobile plating system.

Yet another technical advantage includes the capability to use sophisticated deposition technology without producing or leaving behind any harmful waste byproducts. This is significant.

Other technical advantages are readily apparent to one skilled in the art from the following figures, description, and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts, in which.

DETAILED DESCRIPTION OF THE INVENTION

It should be understood at the outset that although an exemplary implementation of the present invention is illustrated below, the present invention may be implemented using any number of techniques, whether currently known or in existence. The present invention should in no way be limited to the exemplary implementations, drawings, and techniques illustrated below, including the exemplary design and implementation illustrated and described herein.

Initially, a system and method for plasma plating is described in detail below in connection with FIGS. 1–6 to illustrate a type of deposition technology that may be used with the mobile plating system and method. Finally, an embodiment of the mobile plating system and method are described in detail in connection with FIGS. 7–9 that implements, as an example, the plasma plating system type of deposition technology detailed previously in connection with FIGS. 1–6.

Figure 1:
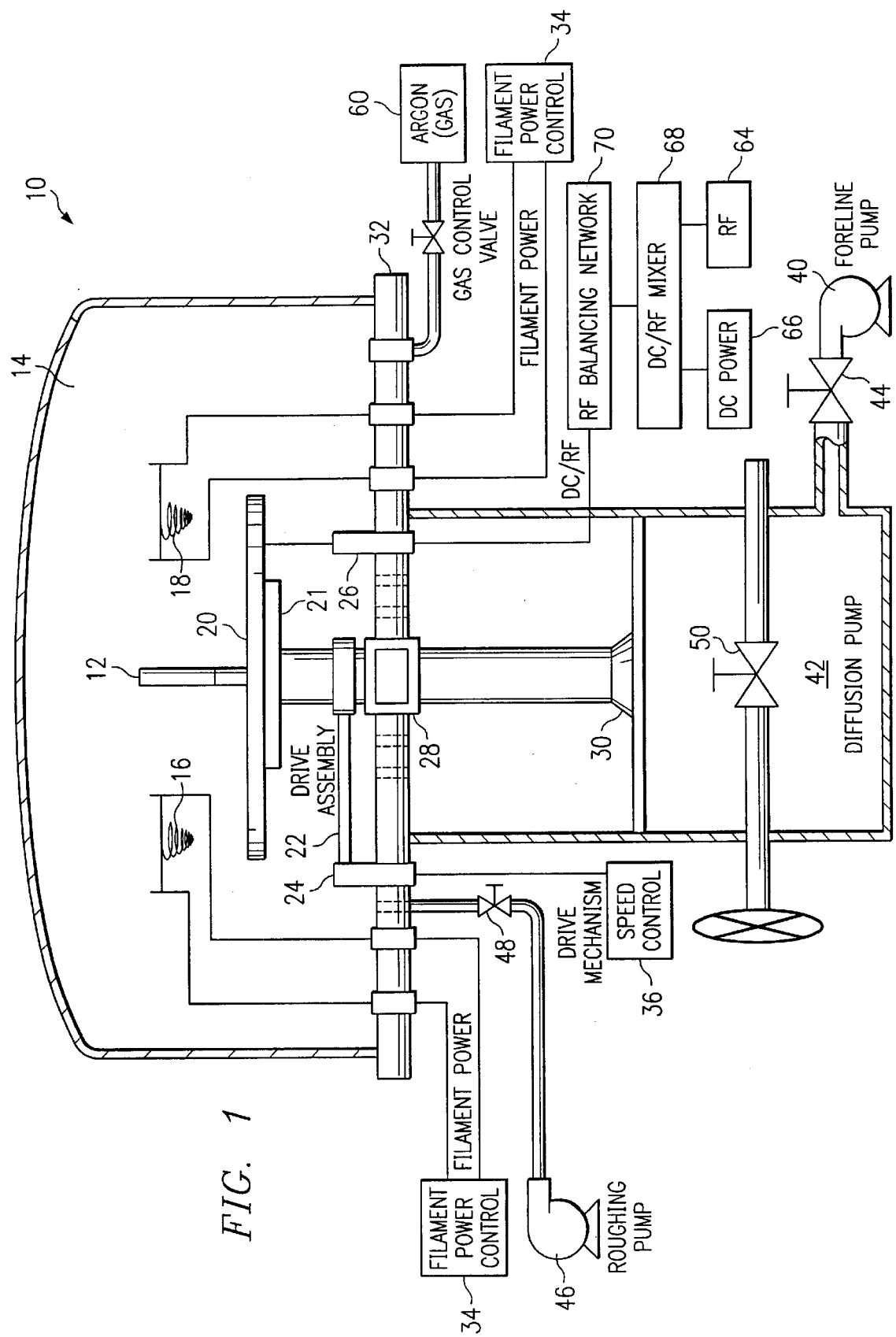
FIG. 1 is a schematic diagram that illustrates a system for plasma plating that can be used to plate materials, according to an embodiment of the present invention.

FIG. 1 is a schematic diagram that illustrates a system 10 for plasma plating that can be used to plate any of a variety of materials, according to an embodiment of the present invention. The system 10 includes various equipment used to support the plasma plating of a substrate 12 within a vacuum chamber 14. Once appropriate operating parameters and conditions are achieved, a depositant provided in a filament 16 and a filament 18 may be evaporated or vaporized to form a plasma. The plasma will contain, generally, positively charged ions from the depositant and will be attracted to the substrate 12 where they will form a deposition layer. The plasma may be thought of as a cloud of ions that surround or are located near the substrate 12. The plasma will generally develop a dark region, near the closest surface of the substrate 12 from the filament 16 and the filament 18, that provides acceleration of the positive ions to the substrate 12.

The filament 16 and the filament 18 reside within the vacuum chamber 14 along with a platform 20, which supports the substrate 12. A drive assembly 22 is shown coupled between a drive motor 24 and a main shaft of the platform 20 within the vacuum chamber 14. In the embodiment shown in FIG. 1, the platform 20 is provided as a turntable that rotates within the vacuum chamber 14. The drive assembly 22 mechanically links the rotational motion of the drive motor 24 with the main shaft of the platform 20 to impart rotation to the platform 20. The rotation of the main shaft of the platform 20 is enhanced through various support bearings such as a base plate bearing 28 and a platform bearing 30.

As is illustrated, the vacuum chamber 14 resides or is sealed on a base plate 32. The vacuum chamber 14 may be provided using virtually any material that provides the appropriate mechanical characteristics to withstand an internal vacuum and an external pressure, such as atmospheric pressure. For example, the vacuum chamber 14 may be provided as a metal chamber or as a glass bell. In an alternative embodiment, the base plate 32 serves as the platform 20 to support the substrate 12. The base plate 32 may be thought of as part of the vacuum chamber 14.

The base plate 32 also provides mechanical support for the system 10 while allowing various devices to feed through from its bottom surface to its top surface within the vacuum chamber 14. For example, the filament 16 and the filament 18 receive power from a filament power control module 34. It should be noted that although two filament power control modules 34 are shown in FIG. 1, preferably, these two modules are implemented as one module. In order to provide power to the filament 16 and the filament 18, electrical leads must feed through the base plate 32 as illustrated in FIG. 1. Similarly, the drive motor 24 must also penetrate or feed through the base plate 32 to provide mechanical action to the drive assembly 22 so that the platform 20 may be rotated. The electrical feed through 26, described more fully below, also feeds through the base plate 32 and provides an electrical conductive path between the platform 20 and various signal generators, also described more fully below. In a preferred embodiment, the electrical feed through 26 is provided as a commutator that contacts the bottom surface of the platform 20, in the embodiment where the platform 20 is implemented as a turntable. The electrical feed through 26 may be implemented as a commutator and may be implemented as a metal brush which can contact the bottom surface of the platform 20 and maintain an electrical contact even if the platform 20 rotates.

The filament power control module 34 provides an electric current to the filament 16 and the filament 18. In one embodiment, the filament power control module 34 can provide current to the filament 16 for a particular duration, and then provide current to the filament 18 during a second duration. Depending upon how the filaments are configured, the filament power control module 34 may provide current to both the filament 16 and the filament 18 at the same time or during separate intervals. This flexibility allows more than one particular depositant material to be plasma plated onto the substrate 12 at different times. The filament power control module 34 preferably provides alternating current to the filaments, but may provide a current using any known method of generating current. In a preferred embodiment, the filament power control module 34 provides current at an amplitude or magnitude that is sufficient to generate enough heat in the filament 16 to evaporate or vaporize the depositant provided therein.

In order to ensure even heating of the depositant, which will be provided at or in the filament 16 or the filament 18, the current provided by the filament control module 34 will preferably be provided using incremental staging so that a more even heat distribution will occur in the depositant that is being melted within the vacuum chamber 14.

In a preferred embodiment, the platform 20 is implemented as a turntable and rotates using the mechanical linkage as described above. A speed control module 36, as shown in FIG. 1, may be provided to control the speed of the rotation of the platform 20. Preferably, the rotation of the platform 20 occurs at a rate from five revolutions per minutes to 30 revolutions per minute. It is believed that an optimal rotational rate of the platform 20 for plasma plating is provided at a rotational rate of 12 revolutions per minute to 15 revolutions per minute. The advantages of rotating the platform 20 are that the substrate 12 can be more evenly plated or coated. This is especially true when multiple substrates are provided on the surface of the platform 20. This allows each one of the multiple substrates to be similarly positioned, on average, within the vacuum chamber 14 during the plasma plating process.

In other embodiments, the platform 20 may be provided at virtually any desired angle or inclination. For example, the platform 20 may be provided as a flat surface, a horizontal surface, a vertical surface, an inclined surface, a curved surface, a curvilinear surface, a helical surface, or as part of the vacuum chamber such as a support structure provided within the vacuum chamber. As mentioned previously, the platform 20 may be stationary or rotate. In an alternative embodiment, the platform 20 includes rollers that may be used to rotate one or more substrates.

The platform 20, in a preferred embodiment, provides or includes an electrically conductive path to provide a path between the electrical feed through 26 and the substrate 12. In one embodiment, platform 20 is provided as a metal or electrically conductive material such that an electrically conductive path is provided at any location on the platform 20 between the electrical feed through 26 and the substrate 12. In such as a case, an insulator 21, will be positioned between the platform 20 and the shaft that rotates the platform 20 to provide electrical isolation. In another embodiment, the platform 20 includes electrically conductive material at certain locations on its top surface that electrically coupled to certain locations on the bottom surface. In this manner, the substrate 12 can be placed at an appropriate location on the top side of the platform 20 while the electrical feed through 26 may be positioned or placed at an appropriate location on the bottom side of the platform 20. In this manner, the substrate 12 is electrically coupled to the electrical feed through 26.

The electrical feed through 26 provides a dc signal and a radio frequency signal to the platform 20 and the substrate 12. The desired operational parameters associated with each of these signals are described more fully below. Preferably, the dc signal is generated by a dc power supply 66 at a negative voltage and the radio frequency signal is generated by an rf transmitter 64 at a desired power level. The two signals are then preferably mixed at a dc/rf mixer 68 and provided to the electrical feed through 26 through an rf balancing network 70, which provides signal balancing by minimizing the standing wave reflected power. The rf balancing network 70 is preferably controlled through a manual control.

In an alternative embodiment, the platform 20 is eliminated, including all of the supporting hardware, structures, and equipment, such as, for example, the drive motor 24, and the drive assembly 22. In such a case the substrate 12 is electrically coupled to the electrical feed through 26.

The remaining equipment and components of the system 10 of FIG. 1 are used to create, maintain, and control the desired vacuum condition within the vacuum chamber 14. This is achieved through the use of a vacuum system. The vacuum system includes a roughing pump 46 and a roughing valve 48 that is used to initially pull down the pressure in the vacuum chamber 14. The vacuum system also includes a foreline pump 40, a foreline valve 44, a diffusion pump 42, and a main valve 50. The foreline valve 44 is opened so that the foreline pump 40 can began to function. After the diffusion pump 42 is warmed or heated to an appropriate level, the main valve 50 is opened, after the roughing pump 46 has been shut in by closing the roughing valve 48. This allows the diffusion pump 42 to further reduce the pressure in the vacuum chamber 14 below a desired level.

A gas 60, such as argon, may then be introduced into the vacuum chamber 14 at a desired rate to raise the pressure in the vacuum chamber 14 to a desired pressure or to within a range of pressures. A gas control valve controls the rate of the flow of the gas 60 into the vacuum chamber 14 through the base plate 32.

Once all of the operating parameters and conditions are established, as will be described more fully below in connection with FIGS. 5 and 6 according to the teachings of the present invention, plasma plating occurs in system 10. The substrate 12 may be plasma plated with a deposited layer, which may include one or more layers such as a base layer, a transitional layer, and a working layer, through the formation of a plasma within the vacuum chamber 14. The plasma will preferably include positively charged depositant ions from the evaporated or vaporized depositant along with positively charged ions from the gas 60 that has been introduced within the vacuum chamber 14. It is believed, that the presence of the gas ions, such as argon ions, within the plasma and ultimately as part of the depositant layer, will not significantly or substantially degrade the properties of the depositant layer. The introduction of the gas into the vacuum chamber 14 is also useful in controlling the desired pressure within the vacuum chamber 14 so that a plasma may be generated according to the teachings of the present invention. In an alternative embodiment, the plasma plating process is achieved in a gasless environment such that the pressure within the vacuum chamber 14 is created and sufficiently maintained through a vacuum system.

The generation of the plasma within the vacuum chamber 14 is believed to be the result of various contributing factors such as thermionic effect from the heating of the depositant within the filaments, such as the filament 16 and the filament 18, and the application of the dc signal and the radio frequency signal at desired voltage and power levels, respectively.

The vacuum system of the system 10 may include any of a variety of vacuum systems such as a diffusion pump, a foreline pump, a roughing pump, a cryro pump, a turbo pump, and any other pump operable or capable of achieving pressures within the vacuum chamber 14 according to the teachings of the present invention.

As described above, the vacuum system includes the roughing pump 46 and the diffusion pump 42, which is used with the foreline pump 40. The roughing pump 46 couples to the vacuum chamber 14 through the roughing valve 48. When the roughing valve 48 is open, the roughing pump 46 may be used to initially reduce the pressure within the vacuum chamber 14. Once a desired lower pressure is achieved within the vacuum chamber 14, the roughing valve 48 is closed. The roughing pump 46 couples to the vacuum chamber 14 through a hole or opening through the base plate 32. The roughing pump 46 will preferably be provided as a mechanical pump. In a preferred embodiment of the vacuum system of the system 10 as shown in FIG. 1, the vacuum system in this embodiment also includes a foreline pump 40 coupled to a diffusion pump 42 through a foreline valve 44. The foreline pump 40 may be implemented as a mechanical pump that is used in combination with the diffusion pump 42 to reduce the pressure within the vacuum chamber 14 to a level even lower than that which was produced through the use of the roughing pump 46.

After the roughing pump 46 has reduced the pressure within the vacuum chamber 14, the diffusion pump 42, which uses heaters and may require the use of cooling water or some other substance to cool the diffusion pump 42, couples with the vacuum chamber 14 through a main valve 50 and through various holes or openings through the base plate 32 as indicated in FIG. 1 by the dashed lines above the main valve 50 and below the platform 20. Once the diffusion pump 42 has been heated up and made ready for operation, the main valve 50 may be opened so that the pressure within the vacuum chamber 14 may be further reduced through the action of the diffusion pump 42 in combination with the foreline pump 44. For example, the pressure within the vacuum chamber 14 may be brought below 4 milliTorr. During a backsputtering process, the pressure in the vacuum chamber 14 may be dropped to a level at or below 100 milliTorr on down to 20 milliTorr. Preferably, the pressure within the vacuum chamber 14 during a backsputtering process will be at a level at or below 50 milliTorr on down to 30 milliTorr. During normal operation of the system 10 during a plasma plating process, the pressure within the vacuum chamber 14 may be reduced by the vacuum system to a level at or below 4 milliTorr on down to a value of 0.1 milliTorr. Preferably, the vacuum system will be used during a plasma plating process to reduce the pressure within the vacuum chamber 14 to a level at or below 1.5 milliTorr on down to 0.5 milliTorr.

Figure 2:
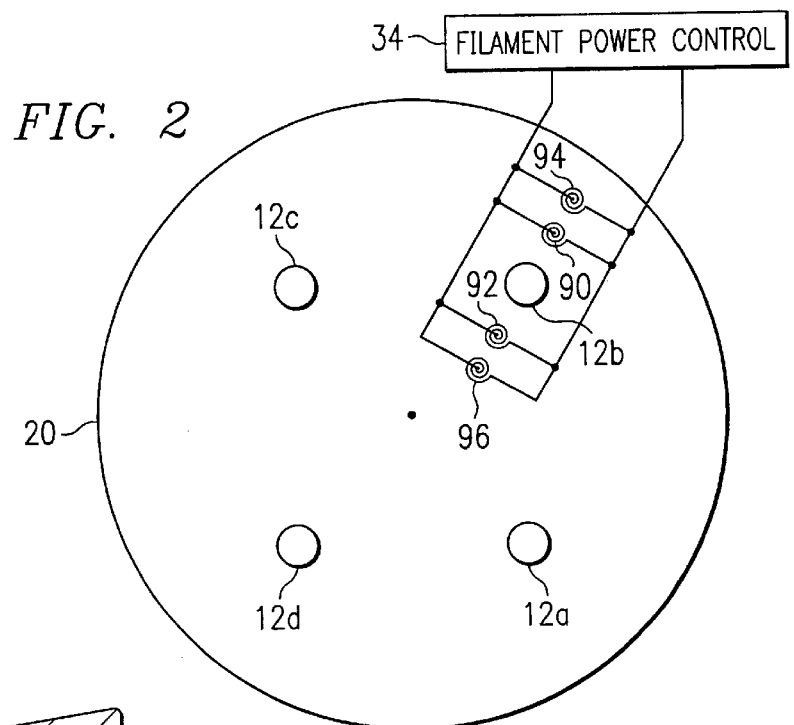
FIG. 2 is a top view of a vacuum chamber of a system for plasma plating that illustrates one embodiment of a platform implemented as a turntable.

FIG. 2 is a top view of a vacuum chamber of a system for plasma plating that illustrates one embodiment of a platform implemented as a turntable 20. The turntable 20 is shown with substrates 12a, 12b, 12c, and 12d positioned, symmetrically on the surface of the turntable 20. The turntable 20 may rotate either clockwise or counterclockwise. The substrates 12a–12d may be virtually any available material and are shown in FIG. 2 as round, cylindrical components such that the top view of each of the substrates presents a circular form.

The filament power control module 34 is electrically coupled to a first set of filaments 94 and 96 and a second set of filaments 90 and 92. Although the electrical connections are not fully illustrated in FIG. 2, it should be understood that the filament power control module 34 may supply current to the first set of filaments 94 and 96 or to the second set of filaments 90 and 92. In this manner, the deposition layer may be provided with two sublayers such as a base layer and a working layer. The base layer will preferably be applied first through depositants provided in the first set of filaments 94 and 96 while the working layer will be deposited on the base layer of the substrates 12a–12d using the depositants provided at the second set of filaments 90 and 92.

The arrangement of the substrates in FIG. 2 may be described as an array of substrates that include inwardly facing surfaces, which are closer to the center of the turntable 20, and outwardly facing surfaces, which are closer to the outer edge of the turntable 20. For example, the inwardly facing surfaces of the array of substrates 12a–d will be presented to the filament 92 and the filament 96, at different times of course, as they are rotated near the filaments. Similarly, the outwardly facing surfaces of the substrates 12a–d will be presented to the filaments 90 and 94 as they rotate near these filaments.

As mentioned previously, the filament power control module 34 may provide a current in virtually any form, such as a direct current or an alternating current, but preferably provides current as an alternating current.

In operation, turntable 20 rotates, for example, in a clockwise direction such that after substrate 12b passes near or through the filaments, the next substrate that will pass near or through the filaments is substrate 12c, and so on. In one example, the first set of filaments 94 and 96 are loaded with a depositant, such as nickel (or titanium), and the second set of filaments are loaded with a depositant such as the metal alloy silver/palladium. This example illustrates a two shot application or a two layer deposition layer.

After all of the operating parameters have been established within the vacuum chamber, as described throughout herein, the filament power control module 34 may energize or provide alternating current to the first set of filaments 94 and 96 so that the nickel will evaporate or vaporize to form a plasma with the gas, such as argon gas, within the vacuum chamber. The positively charged nickel ions and the positively charged argon ions in the plasma will be attracted to the substrates 12a–d, which are at a negative potential. Generally, the closer the substrate is to the first set of filaments 90 and 92 as it rotates, the more material will be deposited. Because the turntable is rotating, a uniform or more even layer will be applied to the various substrates.

After the first plasma has been plated onto the array of substrates 12a–d to form a base layer of the depositant layer on the substrates, the filament power control module 34 is energized so that a sufficient amount of current is provided to the second set of filaments 90 and 92. Similarly, a plasma is formed between the argon ions and the silver/palladium ions and the working layer is then formed to the substrates that are being rotated.

During the first shot when the base layer is being applied, the outwardly facing surfaces of substrates 12a–d are primarily coated through the nickel depositant located in the filament 94. Similarly, the inwardly facing surfaces of the substrates are coated by the nickel depositant located in the filament 96. The same relation holds true for the second shot where the silver/palladium is plasma plated onto the substrates to form the deposit layer.

Figure 3:
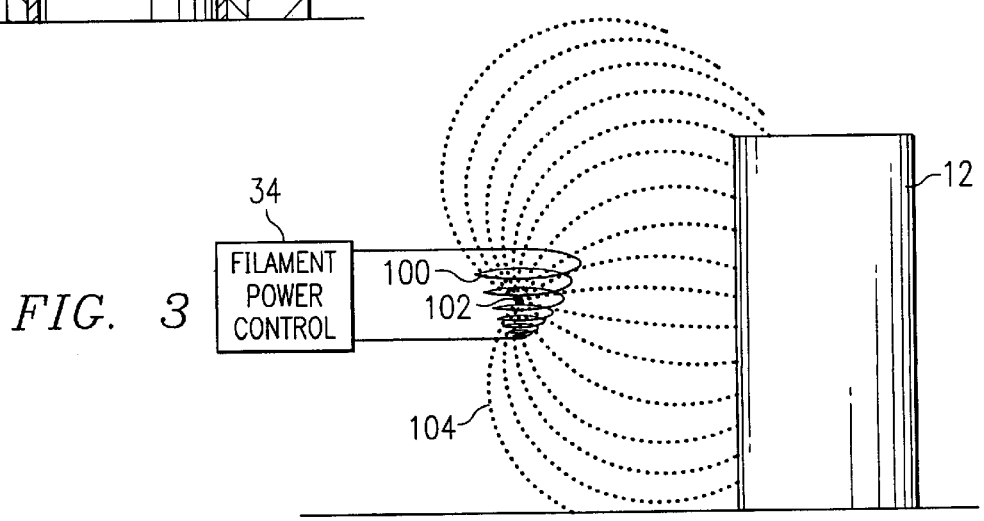
FIG. 3 is a side view that illustrates the formation and dispersion of a plasma around a filament to plasma plate a substrate according to an embodiment of the present invention.

FIG. 3 is a side view that illustrates the formation and dispersion of a plasma around a filament 100 to plasma plate a substrate 12 according to an embodiment of the present invention. The filament 100 is implemented as a wire basket, such as tungsten wire basket, and is shown with a depositant 102 located within, and mechanically supported by, the filament 100. As the filament power control module 34 provides sufficient current to the filament 100, the depositant 102 melts or vaporizes and a plasma 104 is formed. Of course, all of the operating parameters of the present invention must be present in order to achieve the plasma state so that plasma plating may take place.

The substrate 12, which is provided at a negative potential, attracts the positive ions of the plasma 104 to form a deposition layer. As is illustrated, the dispersion pattern of the plasma 104 results in most of the positive ions of the plasma 104 being attracted to the side adjacent or nearest to the filament 100 and the depositant 102. Some wrap around will occur such as that illustrated by the plasma 104 contacting the top surface of the substrate 12. Similarly, some of the positive ions of the plasma 104 may be attracted to the platform or turntable. As is illustrated, the present invention provides an efficient solution for the creation of a deposition layer by ensuring that most of the ions from the depositant are used in the formation of the deposition layer.

Figure 4:
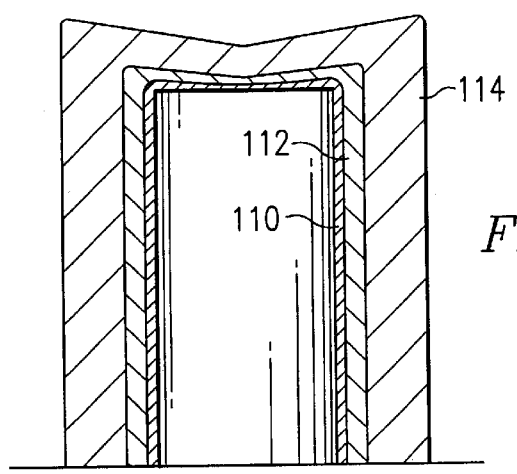
FIG. 4 is a sectional view that illustrates a deposition layer that includes a base layer, a transition layer, and a working layer.

FIG. 4 is a sectional view that illustrates a deposition layer of the substrate 12 that includes a base layer 110, a transition layer 112, and a working layer 114. It should be noted at the outset that the thickness of the various layers that form the deposition layer are grossly out of proportion with the size of the substrate 12; however, the relative thicknesses of the various sublayers or layers of the deposition layer are proportionate to one another, according to one embodiment of the present invention.

Generally, the thickness of the entire deposition layer on the substrate, according to the teachings of the present invention, are believed to generally range between 500 and 20,000 Angstroms. In a preferred embodiment, the entire thickness of the deposition layer is believed to range between 3,000 and 10,000 Angstroms. The present invention provides excellent repeatability and controllability of deposition layer thicknesses, including all of the sublayers such as the base layer 110, the transition layer 112, and the working layer 114. It is believed that the present invention can provide a controllable layer thickness at an acuracy of around 500 Angstroms. It should also be mentioned that the present invention may be used to form a deposition layer with one or any multiple of sublayers.

The thickness of the deposition layer is normally determined based on the nature of intended use of the plasma plated substrate. This may include such variables as the temperature, pressure, and humidity of the operating environment, among many other variables and factors. The selection of the desired metal or depositant type for each layer is also highly dependant upon the nature of the intended use of the plasma plated substrate.

For example, the present invention prevents or substantially reduces galling or mating or interlocking components. Galling includes the seizure of mated components that often occur when two surfaces, such as threaded surfaces, are loaded together. Galling can cause components to fracture and break, which often results in severe damage. Plasma plating may be used to prevent or reduce galling by plating one or more contacting surfaces.

Various depositants may be used to achieve this beneficial effect. It is believed, however, that galling is preferably reduced through a plasma plating process that deposits a base layer of nickel or titanium and a working layer of a silver/palladium metal alloy on one or more contacting surfaces. For high temperature applications, such as over 650 degrees Fahrenheit, it is believed that the galling is preferably reduced through a plasma plating process that deposits a nickel or titanium base layer and a working layer of gold.

It has been found through experimentation that chromium does not work well to reduce galling, this includes when the chromium is deposited as either the base layer, the transition layer, or the working layer. It is believed that chromium may be a depositant that is more difficult to control during the plasma plating process.

Plasma plating may also be used to plate valve parts, such as valve stems in nonnuclear applications, and are preferably plasma plated using a titanium base layer, a gold transition layer, and an indium working layer. In nuclear applications, such as nuclear power plant applications, indium is not a preferred plasma plating depositant because it is considered to be too much of a radioactive isotope absorber. Instead, valve stems in nuclear applications are preferably plasma plated using a nickel base layer and a silver/palladium metal alloy working layer.

As is illustrated in FIG. 4, the working layer 14 is normally provided at a substantially larger thickness than the corresponding transition layer 112 and the base layer 110. It should also be noted that the coating of the top of the substrate 12 is shown to be thin at or near the center or middle of the substrate 12. This effect is due to how the filaments are positioned during the plasma plating process. For example, if the filaments are positioned similarly to that illustrated in FIGS. 2–3, the middle or center portion of the substrate 12 will generally have a thinner overall profile than the side of the deposition layer.

Although various ranges of thicknesses have been discussed herein, it should be understood that the present invention is not limited to any maximum deposition layer thickness. The thickness of the deposition layer, especially the thickness of the working layer 114, can be provided at virtually any desired thickness, normally depending upon the operating environment in which the plasma plated substrate 12 will be introduced. The base layer 110 and the transition layer 112 and any other layers below the working layer 114 will preferably be provided at a substantially smaller thickness than the corresponding thickness of the working layer 114. For example, the base layer 110 and the transition layer 112 may be provided at a thickness ranging from 500 to 750 Angstroms while the working layer 114 may be provided at virtually any thickness such as for example 18,000 Angstroms.

Figure 5:
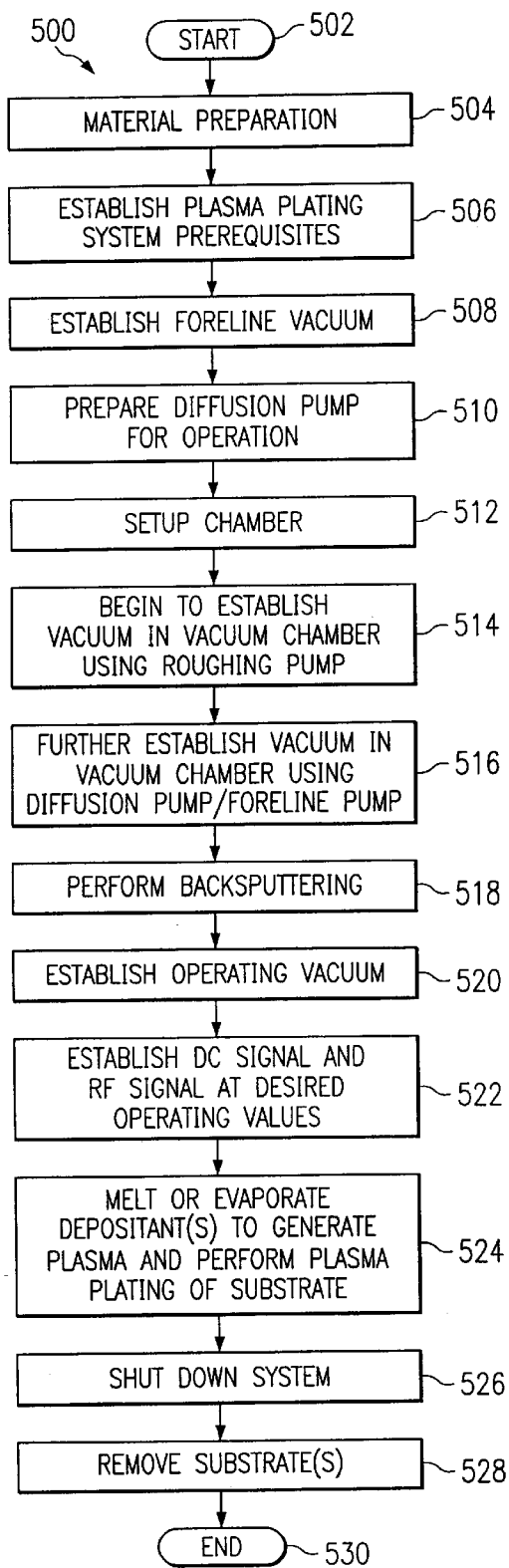
FIG. 5 is a flowchart that illustrates a method for plasma plating according to an embodiment of the present invention.

FIG. 5 is a flow chart of a method 500 for plasma plating according to an embodiment of the present invention. The method 500 begins at block 502 and proceeds to block 504. At block 504, the material or substrate that will be plasma plated is prepared for the process. This may include cleaning the substrate to remove any foreign materials, contaminants, and oils. Any of a variety of known cleaning processes may be used such as those defined by the Steel Structures Painting Council (SSPC). For example, the SSPC-5 standard may be employed to ensure that a substrate is cleaned to a white metal condition. Similarly, the SSPC-10 standard may be employed. Preferably, the substrate will undergo an abrasive blasting, such as for example, bead blasting to further ensure that any foreign materials or contaminants are removed. It should be noted that an oxidation layer may be present on the surface of the substrate. The present invention allows for a deposition layer to be plasma plated onto the substrate surface, even in the presence of an oxidation layer, with excellent adhesion and mechanical properties.

The method 500 proceeds next to block 506 where the plasma plating system prerequisites are established. Depending upon the implementation of the system for plasma plating, this may involve any of a variety of items. In the situation where a diffusion pump is used as part of the vacuum system, items such as the availability of cooling water must be established. Similarly, the adequate availability of lube oil and air to operate the various equipment, valves, and machinery associated with the system for plasma plating must be established. An adequate supply of gas, such as argon gas, should also be verified and checked at this point before proceeding to block 510.

At block 510, assuming that a diffusion pump is used as part of the vacuum system, the diffusion pump is prepared for operation. This may include opening a foreline valve and the starting of the foreline vacuum pump which is used in combination with the diffusion pump. once a foreline vacuum has been drawn, the heaters of the diffusion pump may be energized. This places the diffusion pump in service.

The method 500 proceeds next to block 512 where the vacuum chamber is set up. This includes any number of processes such as positioning the substrate within the vacuum chamber. This is normally achieved by positioning or placing the substrate at a specified location on a platform or turntable located within the vacuum chamber. Before accessing the internal volume of the vacuum chamber, the vacuum chamber seal must be broken and the bell jar or outer member is preferably lifted away from its base plate. Once the substrate is positioned on the platform, the filaments may be positioned relative to the placement of the substrate.

The positioning of the filaments may involve any number of techniques and includes such variables as the amount and type of depositant to be provided at the filament, and the distance, not only relative to the substrate, but relative to other filaments. Generally, the filament will be located a distance ranging from 0.1 inches to 6 inches from the substrate, as measured from the center line of the filament, or from the depositant, to the closest point of the substrate. Preferably, however, the distance between the filament or the depositant and the substrate will range anywhere from 2.75 inches to 3.25 inches when the depositant will serve as the base layer or transition layer of the deposition layer. Similarly, when the depositant will serve as the working layer of the deposition layer that will be deposited on the substrate, the distance between the filament or the depositant and the substrate is preferably provided at a distance between 2 inches and 2.5 inches.

In the situation where multiple depositants or multiple shots will be performed in the plasma plating process, it is necessary to consider the placement of the filaments that will hold the first depositant relative to those that will hold the second depositant as well as each of the filament's position relative to each other and the substrate. Generally the distance of a second filament from a first filament, which will include a depositant that will serve as a base layer, transition layer, or a working layer of a deposition layer, should be anywhere between 0.1 inches and 6 inches.

The spacing between filaments that include depositants that will serve as a base layer, is generally provided between 0.1 inches and 6 inches. Preferably, this distance shall be between 3 inches and 4 inches. The foregoing filament spacing information also applies when the depositant provided in the filaments will serve as the transition layer in the deposition layer. Similarly, the spacing between filaments, which include a depositant that will serve as the working layer of the deposition layer, should generally be between 0.1 inches and 6 inches, but, preferably, will be between 2.5 inches and 3 inches.

The chamber setup of block 512 may also need to take into account the arrangement of an array of substrates on the platform that are being plasma plated. For example, a filament that is positioned in the vacuum chamber so that it will provide a dispersion pattern to provide depositant coverage to inwardly facing surfaces of an array of substrates, it may require anywhere from 20 to 80 percent less mass or weight of depositant when compared with a filament positioned in the vacuum chamber to provide coverage for the array of outwardly facing surfaces. The reference to inwardly and outwardly are relative to the platform or turntable with inwardly referring to those surfaces closer to the center of the platform or turntable. This is because the efficiency of the plasma plating process is greater for the inwardly facing surfaces of an array of substrates than at the outwardly facing surfaces of the array of substrates because of the forces attracting the, generally, positive ions of the plasma. This also ensures that the thickness of the deposition layer on the inwardly facing surfaces and the outwardly facing surfaces are more uniform. In such a case, the weight or mass of the depositant will, preferably, need to vary between such filament positions. Generally, the variance in mass or weight between the two locations may be anywhere from 20 to 80 percent different. Preferably, the depositants in the filaments covering the inwardly facing surfaces will use 40 to 50 percent less mass or weight than the depositants of the filaments covering the outwardly facing surfaces. The amount of the depositant placed in the filaments corresponds to the desired thickness of the deposition layer, and any sublayers thereof. This was discussed more fully and is illustrated more fully in connection with FIG. 3.

The type of filament affects the dispersion pattern achieved through the melting or evaporation of its depositant during the creation of the plasma. Any of a variety of filament types, shapes, and configurations may be used in the present invention. For example, the filament may be provided as a tungsten basket, a boat, a coil, a crucible, a ray gun, an electron beam gun, a heat gun, or as any other structure, such as a support structure provided within the vacuum chamber. The filaments are generally heated through the application of an electric current through the filament. However, any method or means of heating the depositant within the filament may be used in the present invention.

The setup of the vacuum chamber also includes placing the depositants in the one or more filaments. The present invention contemplates the use of virtually any material that is capable of being evaporated under the conditions and parameters of the present invention so that a plasma will form. For example, the depositant may include virtually any metal, such as a metal alloy, gold, titanium, chromium, nickel, silver, tin, indium, lead, copper, palladium, silver/palladium and any of a variety of others. Similarly, the depositant may include any other materials such as carbon, nonmetals, ceramics, metal carbides, metal nitrates, and any of a variety of other materials. The depositants will generally be provided in a pellet, granule, particle, powder, wire, ribbon, or strip form. Once the filaments have been properly positioned and loaded, the vacuum chamber may be closed and sealed. This may include sealing the bell portion of the vacuum chamber with its base plate.

The method 500 proceeds next to block 514 where preparations are made to begin establishing a vacuum condition within the vacuum chamber. In one embodiment, such as the system 10 shown in FIG. 1, a roughing pump is started to begin evacuating the vacuum chamber and to bring the pressure down within the vacuum chamber to a sufficient level so that additional pumps may take over to further reduce the pressure within the vacuum chamber. In one embodiment, the roughing vacuum pump is a mechanical pump that may be started, and a roughing valve may then be opened to provide access to the vacuum chamber. Once the roughing vacuum pump has achieved its desired function and has reduced the pressure in the vacuum chamber to its desired or designed level, the roughing valve is shut. At this point, the method 500 transitions to block 516.

At block 516, the pressure within the vacuum chamber is further reduced using another vacuum pump. For example, in one embodiment, a diffusion pump/foreline pump is utilized to further reduce the pressure within the vacuum chamber. In the embodiment of the present invention as illustrated in FIG. 1, this is achieved by opening the main valve and allowing the diffusion pump, supported by the mechanical foreline pump, to further pull or reduce the pressure in the vacuum chamber.

Generally, the pressure in the vacuum chamber is reduced to a level that is at or below 4 milliTorr. Preferably, the pressure in the vacuum chamber is reduced to a level that is at or below 1.5 milliTorr. In the event that backsputtering, which is described below in connection with block 518 of the method 500, is to be performed, the pressure in the vacuum chamber is reduced to a level below 100 milliTorr and generally in a range between 20 milliTorr and 100 milliTorr. In a preferred embodiment when backsputtering is to be performed, the pressure is reduced in the vacuum chamber at a level below 50 milliTorr, and generally at a level between 20 milliTorr and 50 milliTorr.

Preceding next to block 518, a backsputtering process may be performed to further clean and prepare the substrate. It should be understood, however, that such a process is not mandatory. The backsputtering process is described in more detail below in connection with FIG. 6. The backsputtering process may include the rotation of the platform or turntable within the vacuum chamber. In such a case, the turntable will generally be rotated at a rate at or between 5 revolutions per minute and 30 revolutions per minute. Preferably, the turntable will be rotated at a rate between 12 revolutions per minute and 15 revolutions per minute. The operation of the turntable, which also will preferably be used as the deposition layer is being formed on the substrate according to the teachings of the present invention.

Method 500 proceeds next to block 520 where an operating vacuum is established. Although a vacuum condition has already been established within the vacuum chamber, as previously discussed in connection with block 514 and 516, an operating vacuum can now be established through the introduction of a gas into the vacuum chamber at a flow rate that will raise the pressure in the vacuum chamber to a level generally at or between 0.1 milliTorr and 4 milliTorr. Preferably, the introduction of the gas is used to raise the pressure in the vacuum chamber to a level that is at or between 0.5 milliTorr and 1.5 milliTorr. This will ensure that there are no depositant ion collisions within the plasma, which will increase the depositant efficiency and provide a clean, highly adhered deposition layer to the substrate. The gas that is introduced into the vacuum chamber may be any of a variety of gases but will preferably be provided as an inert gas, a noble gas, a reactive gas or a gas such as argon, xenon, radon, helium, neon, krypton, oxygen, nitrogen, and a variety of other gases. It is desirable that the gas is a noncombustible gas. It should be understood that the present invention does not require the introduction of a gas but may be performed in the absence of a gas.

At block 522, various operating parameters and values of the system are established. This will generally include the rotation of a turntable, if desired, the application of a dc signal, and the application of a radio frequency signal. Assuming that the platform includes a turntable or some other rotating device, the turntable rotation will preferably be established at this point. This assumes, of course, that the rotation of the turntable was not previously started and the discretionary backsputtering block 518. Once the rotation of the turntable has been established, the dc signal and the rf signal may be applied to the substrate. The application of the dc signal to the substrate will generally be provided at a voltage amplitude that is at or between one volt and 5,000 volts. Note that the polarity of the voltage will preferably be negative; however, this is not always required. In a preferred embodiment, the application of the dc signal to the substrate will be provided at a voltage level at or between negative 500 volts and negative 750 volts.

The application of the radio frequency signal to the substrate will generally be provided at a power level that is at or between 1 watt and 50 watts. Preferably, the power level of the radio frequency signal will be provided at 10 watts or between a range defined by 5 watts and 15 watts. The frequency of the radio frequency signal will generally be provided at an industrial specified frequency value in either the kilohertz range or the megahertz range. Preferably, the frequency signal will be provided at a frequency of 13.56 kilohertz. Although the term radio frequency has been used throughout to describe the generation and application of the radio frequency signal to the substrate, it should be understood that the term radio frequency should not be limited to its commonly understood definition of signals having frequencies roughly between 10 kilohertz and 100,000 megahertz. The term radio frequency shall also include any signal with a frequency component that is operable or capable of assisting with the creation or excitation of a plasma in a vacuum chamber.

Block 522 will also preferably include the mixing of the dc signal and the radio frequency signal, using mixer circuitry, to generate a mixed signal. This allows only one signal to be applied to the substrate. This is generally achieved using the electrical feed through that extends through the base plate of the vacuum chamber and contacts an electrically conductive portion of the platform, which in turn electrically couples to the substrate or substrates. Block 522 may also include the balancing of the mixed signal through the use of a radio frequency balancing network. Preferably, the mixed signal is balanced by minimizing the standing wave reflected power. This is preferably controlled through a manual control.

As the output or load characteristics of the antenna or output changes, as seen from the mixer circuitry, problems can arise when electrical signals or waves are reflected from the output load back to the mixer or source. These problems may include damage to the radio frequency transmitter and a reduction in the transfer of power to the substrate and vacuum chamber to ensure the formation of a sufficient plasma to achieve a successful plasma plating process.

This problem can be reduced or solved by including the radio frequency balancing network that can adjust its impedance, including in one embodiment its resistance, inductance, and capacitance, to match or reduce the presence of reflected waves. The impedance and electrical characteristics of the output load or antenna are affected by such things as the presence and/or absence of a plasma and the shape and properties of the substrate or substrates on the platform. Because of such changes during the plasma plating process, the radio frequency balancing network may need to be adjusted during the process to minimize the standing wave reflected power or, stated differently, to prevent or reduce the standing wave ratio return to the radio frequency transmitter. Preferably, these adjustments are performed manually by an operator during the plasma plating process. In other embodiments, the radio frequency balancing network is automatically adjusted. Care must be taken, however, to ensure that the automatic adjustment does not over compensate or poorly track the changes in the output load.

The method 500 proceeds next to block 524 where the depositant or depositants are melted or evaporated so that a plasma will be generated. The generation of the plasma at the conditions provided by the present invention will result in a deposition layer being formed on the surface of the substrate through plasma plating. It is believed that the deposition layer is formed at a medium energy level on the average of between 10 eV and 90 eV.

The depositants are generally evaporated or vaporized by providing a current through the filament around the depositant. In a preferred embodiment, the depositants are slowly or incrementally heated to achieve a more even heat distribution in the depositant. This also improves the formation of the plasma. The current may be provided as an alternating current or as any other current that is sufficient to generate heat in the filament that will melt the depositant. In other embodiments, the depositant may be heated through the introduction of an agent that is in chemical contact with the depositant. In still other embodiments, the depositant may be heated through the use of electromagnetic or microwave energy.

The conditions in the vacuum chamber will be correct for the formation of a plasma. The plasma will generally include gas ions, such as argon ions, and depositant ions, such as gold, nickel, or palladium ions. The gas ions and the depositant ions will generally be provided as positive ions due to the absence of one or more electrons. The creation of the plasma is believed to be assisted through the introduction of the radio frequency signal and because of thermionic phenomena due to the heating of the depositants. It is contemplated that in some situations, a plasma may be generated that includes negatively charged ions.

The negative potential established at the substrate due to the dc signal will attract the positive ions of the plasma. Once again, this will primarily include depositant ions and may include gas ions, such as argon gas ions from the gas that was introduced earlier in method 500. The inclusion of the gas ions, such as argon ions, are not believed to degrade the material or mechanical characteristics of the deposition layer.

It should be noted that some prior literature has suggested that the introduction of a magnet at or near the substrate is desirable to influence the path of the ions of the plasma as they are attracted to the substrate to form the deposition layer. Experimental evidence now suggests that the introduction of such a magnet is actually undesirable and produced unwanted effects. The presence of the magnet may lead to uneven deposition thicknesses, and prevent or significantly impede the controllability, repeatability, and reliability of the process.

Whenever the deposition layer is designed to include multiple sublayers, multiple shots must be performed at block 524. This means that once the base layer depositants have been melted through the heating of their filaments, the transition layer depositants (or the depositant of the next layer to be applied) are heated and melted by the introduction of heat at their filaments. In this manner, any number of sublayers may be added to the deposition layer. Before successive depositant sublayers are formed, the preceding layer shall have been fully or almost fully formed. The method 500 thus provides the significant advantage of allowing a deposition layer to be created through multiple sublayers without having to break vacuum and reestablish vacuum in the vacuum chamber. This can significantly cut overall plasma plating time and costs.

The method 500 proceeds next to block 526 where the process or system is shut down. In the embodiment of the system shown in FIG. 1, the main valve is closed and a vent valve to the vacuum chamber is opened to equalize pressure inside the vacuum chamber. The vacuum chamber may then be opened and the substrate items may be immediately removed. This is because the method 500 does not generate excessive heat in the substrates during the plasma plating process. This provides significant advantages because the material or mechanical structure of the substrate and deposition layer are not adversely affected by excessive temperature. The plasma plated substrates may then be used as needed. Because the temperature of the substrates are generally at a temperature at or below 125 Fahrenheit, the substrates can generally be immediately handled without any thermal protection.

The method 500 provides the additional benefit of not generating any waste byproducts and is environmentally safe. Further, the method 500 is an efficient process that efficiently uses the depositants such that expensive or precious metals, such as gold and silver, are efficiently utilized and are not wasted. Further, due to the fact that the present invention does not use high energy deposition techniques, no adverse metallurgical or mechanical effects are done to the substrate. This is believed to be due to the fact that the deposition layer of the present invention is not deeply embedded within the substrate, but excellent adherence, mechanical, and material properties are still exhibited by the deposition layer. After the substrates have been removed at block 528, the method 500 ends at block 530.

Figure 6:
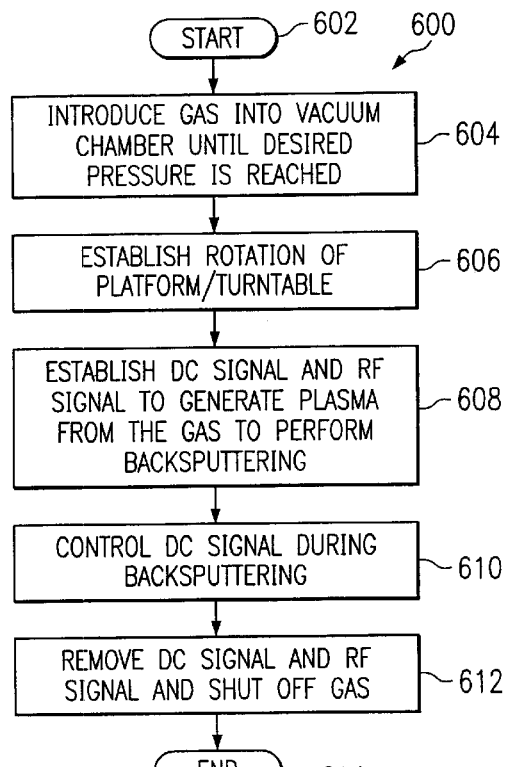
FIG. 6 is a flowchart that illustrates a method for back-sputtering using the system of the present invention, according to an embodiment of the present invention.

FIG. 6 is a flow chart of a method 600 for backsputtering using the system and method of the present invention, according to an embodiment of the present invention. As mentioned previously, backsputtering may be used to further clean the substrate before a deposition layer is formed on the substrate through plasma plating. Backsputtering generally removes contaminants and foreign materials. This results in a cleaner substrate which results in a stronger and more uniform deposition layer. The method 600 begins at block 602 and proceeds to block 604 where a gas is introduced into the vacuum chamber at a rate that maintains or produces a desired pressure within the vacuum chamber. This is similar to what was previously described in block 520 in connection with FIG. 5. Generally, the pressure in the vacuum chamber should be at a level at or below 100 milliTorr, such as at a range between 20 milliTorr and 100 milliTorr. Preferably, the pressure is provided at a level at or between 30 milliTorr and 50 milliTorr.

The method 600 proceeds next to block 606 where rotation of the platform or turntable is established, if applicable. As mentioned previously, the rotation of the turntable may be provided at a rate between 5 revolutions per minute and 30 revolutions per minute but is preferably provided at a rate between 12 revolutions per minute and 15 revolutions per minute.

Proceeding next to block 608, a dc signal is established and is applied to the substrate. The dc signal will generally be provided at an amplitude at or between one volt and 4,000 volts. Preferably, the dc signal will be provided at a voltage between negative 100 volts and negative 250 volts.

Block 608 also involves the generation of a radio frequency signal that will be applied to the substrate. The radio frequency signal will generally be provided at a power level at or between 1 watt and 50 watts. Preferably, the radio frequency signal will be provided at a power level of 10 watts or at or between 5 and 15 watts. The dc signal and the radio frequency signal are preferably mixed, balanced, and applied to the substrate as a mixed signal. As a consequence, a plasma will form from the gas that was introduced at block 604. This gas will generally be an inert gas or noble gas such as argon. The formation of the plasma includes positive ions from the gas. These positive ions of the plasma will be attracted and accelerated to the substrate, which will preferably be provided at a negative potential. This results in contaminants being scrubbed or removed from the substrate. Once the contaminants or foreign matter are removed from the substrate, they are sucked out of the vacuum chamber through the operation of the vacuum pump, such as the diffusion pump.

Proceeding next to block 610, the backsputtering process continues for a period of time that is generally between 30 seconds and one minute. Depending on the condition and cleanliness of the substrate, the backsputtering process may continue for more or less time. Generally, the backsputtering process is allowed to continue until the capacitance discharge, created by the backsputtering process is substantially complete or is significantly reduced. This may be visually monitored through the observation of sparks or light bursts that coincide with the capacitive discharge from the contaminants from the substrate. This may be referred to as microarcing.

During the backsputtering process, the dc signal must be controlled. This is normally achieved through manual adjustments of a dc power supply. Preferably, the voltage of the dc signal is provided at a level that allows the voltage to be maximized without overloading the dc power supply. As the backsputtering process continues, the current in the dc power supply will vary because of changes in the plasma that occur during the backsputtering process. This makes it necessary to adjust the voltage level of the dc signal during the backsputtering process.

The method 600 proceeds next to block 612 where the dc signal and the radio frequency signal are removed and the gas is shut off. The method 600 proceeds next to block 614 where the method ends.

Figure 7:
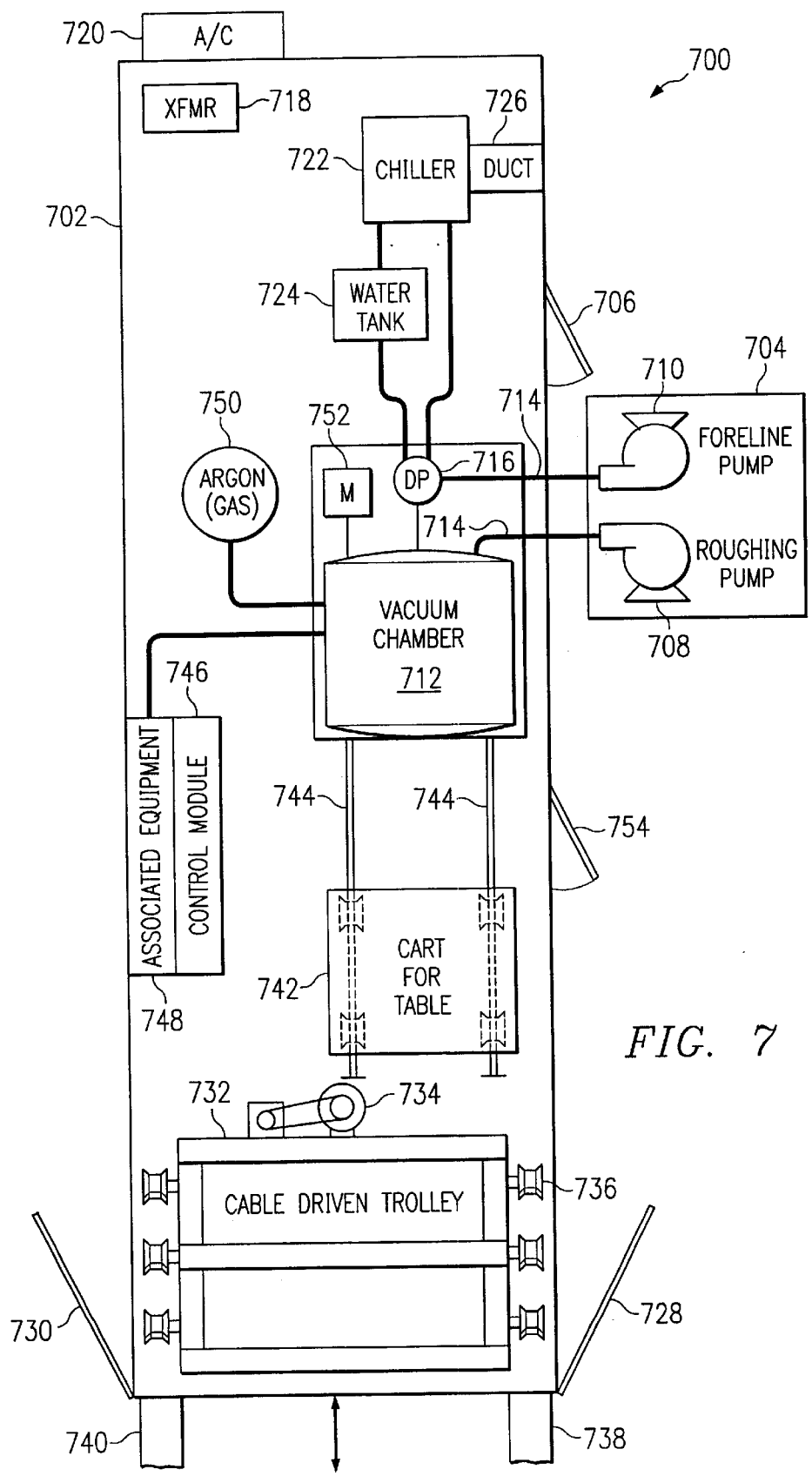
FIG. 7 is a top view of a mobile plating system according to one embodiment of the present invention.

FIG. 7 is a top view of a mobile plating system 700 according to one embodiment of the present invention. The mobile plating system 700 is implemented using a mobile storage volume 702. In a preferred embodiment, the mobile storage volume 702 is a enclosed or semi-enclosed trailer commonly used and pulled by a diesel truck, such as a "semi" or "18 wheeler." It should be understood, however, that the mobile storage volume 702 of the present invention may be implemented using virtually any available mobile storage volume, cargo box, trailer, or the like such as, for example, a cargo box, a SEA/LAND cargo box, the, internal storage volume of a truck-trailer or tractor-trailer, a semi-trailer, a freight van, a refrigerated van, a freight trailer, a reefer, a platform trailer, a dump trailer, a tractor-trailer, or an enclosed deck trailer. Although the preferred embodiment of the mobile storage volume 702 is that of an enclosed or semi-enclosed volume, the present invention is so limited, and could, in another embodiment, be implemented in an open or semi-open trailer or cargo box.

The mobile plating system 700 is shown with an external vacuum pump 704 positioned external to the mobile storage volume 702. This illustrates the situation where the mobile plating system 700 is stationary and operational. When the mobile plating system 700 is in transit or not in an operational mode, the external vacuum pump 704 may be stored within the mobile storage volume 702. For example, an access door 706 is shown near the external vacuum pump 704, and, in a preferred embodiment, the external vacuum pump 704 may be stored within the mobile. storage volume 702 using the access door 706. The external vacuum pump 704 would then reside within the mobile storage volume 702 during transit. The present invention should not be limited to any location or existence of any access door, such as the access door 706 or an access door 754, which also provides access to the mobile storage volume 702. In a preferred embodiment, the external vacuum pump 704 includes a mechanical roughing pump 708 and a mechanical foreline pump 710 mounted to a skid. In this manner, the external vacuum pump 704 may be conveniently and quickly moved to and from the mobile storage volume 702 through the access door 706. For example, the external vacuum pump 704 may be moved to and from the mobile storage volume 702 using a forklift.

The placement and operation of the external vacuum pump 704 external to the mobile storage volume 702 provides the significant technical advantage of reducing or eliminating internal vibration, noise, and leaks that could arise within the equipment and systems provided in the mobile storage volume 702 during the plating process. These types of vibrations and mechanical strain can dramatically harm the overall plating process. In general, the external vacuum pump 704 is provided to assist with producing a desired pressure within a vacuum chamber 712, which is positioned within the mobile storage volume 702, so that the desired plating process may take place under desired and reliable operating parameters. In a preferred embodiment, the roughing pump 708 couples with the vacuum chamber 712 through or using a flexible piping segment 714. Similarly, the foreline pump 710 may couple to or with the vacuum chamber 712 using a flexible piping segment 714 and, in the embodiment shown in FIG. 7, through an internal vacuum pump 716, which is shown implemented as a diffusion pump. The flexible piping 714 also assists with eliminating, reducing, or isolating the mechanical vibration, strain, and noise induced by the external vacuum pump 704 on other equipment, machines, and systems, in addition to the external vacuum pump 704 being located external to the mobile storage volume 702. In addition, the flexible piping segment 714 allows for the movement of such flexible piping segment so that pipes are not mechanically stressed, fatigued, and potentially cracked or broken, which would require a complete shut-down of the mobile plating system 700. One embodiment of the interface between the external vacuum pump 704 and the vacuum chamber 712 (and internal vacuum pump 716) are illustrated more fully in the description below in connection with FIG. 8.

Before proceeding, it should be emphasized that the mobile plating system 700 of the present invention is not limited in any manner to any particular type of plating process, system, or deposition technology. As was described in detail above in connection with FIGS. 1–6, a plasma plating system or process may be implemented using the mobile plating system 700. The present invention may utilize virtually any known or available plating process that uses a vacuum chamber and a vacuum pump. For example, and without limitation, the mobile plating system 700 may use any of the following plating processes: vacuum deposition, physical vapor deposition, chemical vapor deposition, sputtering, ion plating, and ion implantation. In essence, the mobile plating system 700 that is illustrated in FIG. 7 reflects an implementation of the plasma plating system 10 that has been described above in connection with FIG. 1.

The mobile storage volume 702 may electrically couple to a source of electricity through a transformer 718. The transformer 718 may then provide the appropriate, desired, or required voltages and power needed by the various equipment and systems of the mobile plating system 700. In one embodiment, not illustrated in FIG. 7, an electrical bus may be provided near the ceiling of the mobile storage volume 702 so that the electrical source is conveniently available throughout the mobile storage volume 702 but is positioned in such a manner that it is not a safety hazard. An air conditioner 720 is also shown in FIG. 7. The air conditioner 720 functions to provide a suitable and comfortable working environment within the mobile storage volume 702 and assist with cooling any equipment that needs cooling.

A cooling system is shown within the mobile storage volume 702 that includes a chiller 722, a water tank 724 and appropriate plumbing or coupling so that chilled or cooled water may be provided from the chiller 722 to the internal vacuum pump 716, which is shown implemented as a diffusion pump, where heat is exchanged between the cooled water and the internal vacuum pump 716 and the water is then provided back to the water tank 724, where it can later be provided to the chiller 722 for cooling. Although this was not shown in the system 10 of FIG. 1, the internal vacuum pump 716, similar to the diffusion pump 42 of FIG. 1, requires a cooling system to operate appropriately to ensure that operating pressures within the vacuum chamber 712 are generated and maintained as required by the particular plating process. The chiller 722 may be implemented using a refrigeration unit such that hot exhaust air generated by the refrigeration unit may be vented from within the interior of the mobile storage volume 702 through a duct 726.

The mobile plating system 700 of the present invention also provides the significant advantage of allowing very large, bulky, and heavy components to be handled with relative ease. The substrate, part, or component to be coated or plated is received at the main access point of the mobile storage volume 702, which is located and created when a main access door 728 and a main access door 730 are opened, as is illustrated in FIG. 7. In the situation where the substrate is especially heavy or cumbersome, a trolley/hoist assembly 732 is provided near the main access point or opening. In the embodiment shown, the trolley/hoist 732 includes a frame structure mounted near the ceiling of the mobile storage volume 702. The frame structure of the trolley/hoist 732 is moveable and is powered through a motor 734. The motor 734 allows the trolley/hoist 732 to roll or slide into or out of the main opening of the mobile storage volume 702 on or along railings positioned near the ceiling or upper portion of the mobile storage volume 702 using wheels, such as a wheel 736 as illustrated. In a preferred embodiment, the mobile plating system 700 includes railing extensions 738 and 740 (which may also be referred to as "trolley-wings") that are hingeably mounted such that the railing extensions 738 may be positioned to extend the railings mentioned above for the trolley/hoist 732 to extend outside of the mobile storage volume 702.

As is indicated by the double arrow, the trolley/hoist 732 may move within and out of the mobile storage volume 702. When the trolley/hoist 732 is moved out of the mobile storage volume 702, the railing extension 738 and 740 provide the rail in which the various wheels, such as the wheel 736, of the trolley/hoist 732 may ride or roll upon.

In operation, a bulky or cumbersome piece is provided at the outside of the main opening or access point of the mobile storage volume 702. The trolley/hoist 732 is then moved, using the motor 734 such that the hoist (not specifically shown in FIG. 7) of the trolley/hoist 732 is positioned over or near the bulky substrate. As explained previously, the rolling extension 738 and 740 are used to support the trolley/hoist 732 as it is provided outside the mobile storage volume 702 of the mobile plating system 700. The hoist, which is preferably provided as an electrical or motorized hoist, is then lowered and the substrate is raised to an appropriate level. The trolley/hoist 732 is then positioned to within the main opening of the mobile storage volume 702 until the substrate is provided at a desired position.

The desired position of the substrate will, preferably, be provided generally over a moveable cart or platform 742. The substrate is then placed on the moveable cart or platform 742 by lowering the substrate using the hoist of the trolley/hoist 732. The moveable cart or platform 742, in the preferred embodiment as shown in FIG. 7, may be provided on tracks 744. This allows the substrate to be moved to the vacuum chamber 712 using the moveable cart or platform 742 over the tracks 744. A table or platform may be positioned on top of the moveable cart or platform 742 and will, preferably, be provided so that the substrate rests upon this surface. This table or platform and the substrate may then be positioned within the vacuum chamber 712 such that, in one embodiment, the table or platform, with the substrate on its surface, is slid into the vacuum chamber 712 along railings provided within the sides of the vacuum chamber 712. The vacuum chamber 712 is illustrated, in the embodiment of FIG. 7, as a large metal vessel with a large door opening nearest the tracks 744. The vacuum chamber 712 may be provided in any of a variety of known or available configurations and materials.

Now that the bulky or cumbersome substrate (or any other substrate for that matter) is provided within the vacuum chamber 712, the plating process may proceed as desired. For example, the plating process may utilize the method for plasma plating, as discussed above in connection with FIG. 5. In such a case, the appropriate operational parameters are established using all of the equipment previously described in connection with FIG. 1. Generally, a control module 746 is used to control all or some of the various vacuum pumps, valves, and other associated equipment, such as associated equipment 748, needed to perform and monitor the plating process. The associated equipment 748 may include, in one embodiment, equipment similar to what is shown in FIG. 1. For example, the associated equipment 748 may include a dc power supply operable to generate a desired voltage at the substrate, similar to the dc power supply 66 of FIG. 1, an rf transmitter operable to generate an rf signal at a desired power level at the substrate, similar to the rf transmitter 64 of FIG. 1, a filament power control module operable to generate a current at a desired level at a filament within the vacuum chamber 712. The control module 746 may also provide the controls for the introduction of a gas into the vacuum chamber 712 such as argon gas 750. The control module 746 may also control a motor 752, which is used to provide mechanical energy within the vacuum chamber 712 such as for mechanical energy to rotate a turntable or rollers on the platform in which the substrate rests. This is similar to the drive motor 24 of FIG. 1.

In still other embodiments, the mobile plating system 700 may include a bead blast cabinet within the mobile storage volume 702. The bead blast cabinet, which is not shown in FIG. 7, may be used to clean a substrate before introducing the substrate into the vacuum chamber 712 for plating.

Figure 8:
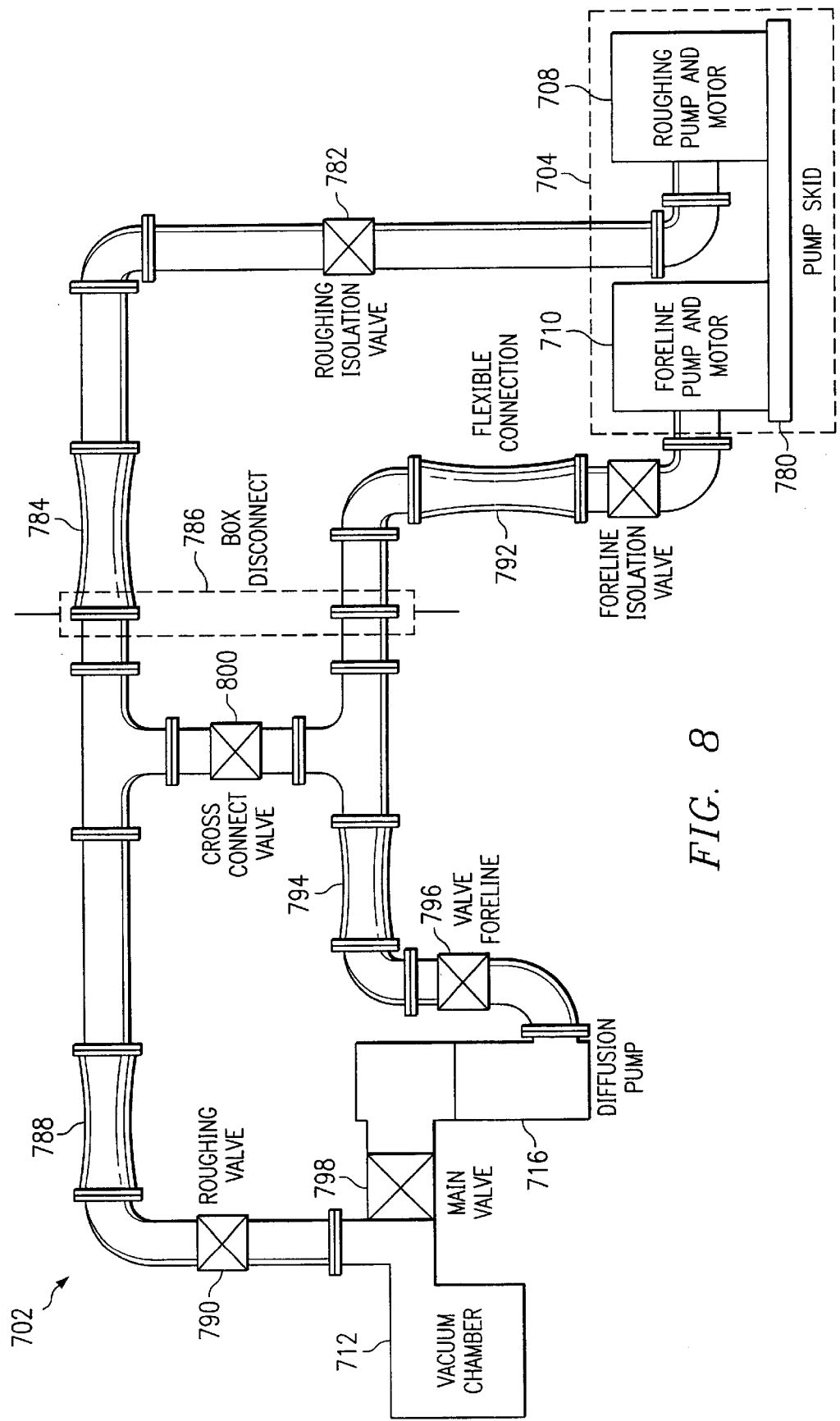
FIG. 8 is a side view of a connection of an external vacuum pump to a vacuum chamber of the mobile plating system.

FIG. 8 is a side view of a connection of the external vacuum pump 704 to the vacuum chamber 712 of the mobile plating system 700, according to one embodiment of the present invention. The external vacuum pump 704 includes the roughing pump 708 and the foreline pump 710. Both the roughing pump 708 and the foreline pump 710 are shown with both a pump and a motor and are shown mounted on a skid 780. In a preferred embodiment, the skid 780 is operable to be lifted with a forklift.

The roughing pump 708 couples to the vacuum chamber 712 through piping that includes a roughing isolation valve 782, a flexible piping segment 784 that extends through or to a disconnect box 786 at the mobile storage volume 702 to within the mobile storage volume 702. Within the mobile storage volume 702, the coupling between the roughing pump 708 and the vacuum chamber 712 further includes a flexible piping segment 788, and a roughing valve 790 before coupling directly to the vacuum chamber 712.

The coupling between the foreline pump 710 of the external vacuum pump 704 to the diffusion pump of internal vacuum pump 716 and then to the vacuum chamber 712 includes various piping elements similar to what was just described with respect to the roughing pump 708. This coupling or connection includes a flexible piping segment 792, which couples to piping that connects with the disconnect box 786 to extend within the mobile storage volume 702, a flexible piping segment 794 and a foreline valve 796 before coupling directly with the diffusion pump 716. The diffusion pump 716 then couples with the vacuum chamber 712 through a main valve 798.

A cross-connect valve 800 is shown providing a coupling between the two paths just described. Although the cross-connect valve 800 is normally closed, in the event that either the mechanical foreline pump 710 or the mechanical roughing pump 708 breaks down or requires maintenance, the cross-connect valve 800 allows only one of the just described pumps to be used to create the desired vacuum within the vacuum chamber 712. This provides significant flexibility and enhances overall operational reliability.

Figure 9:
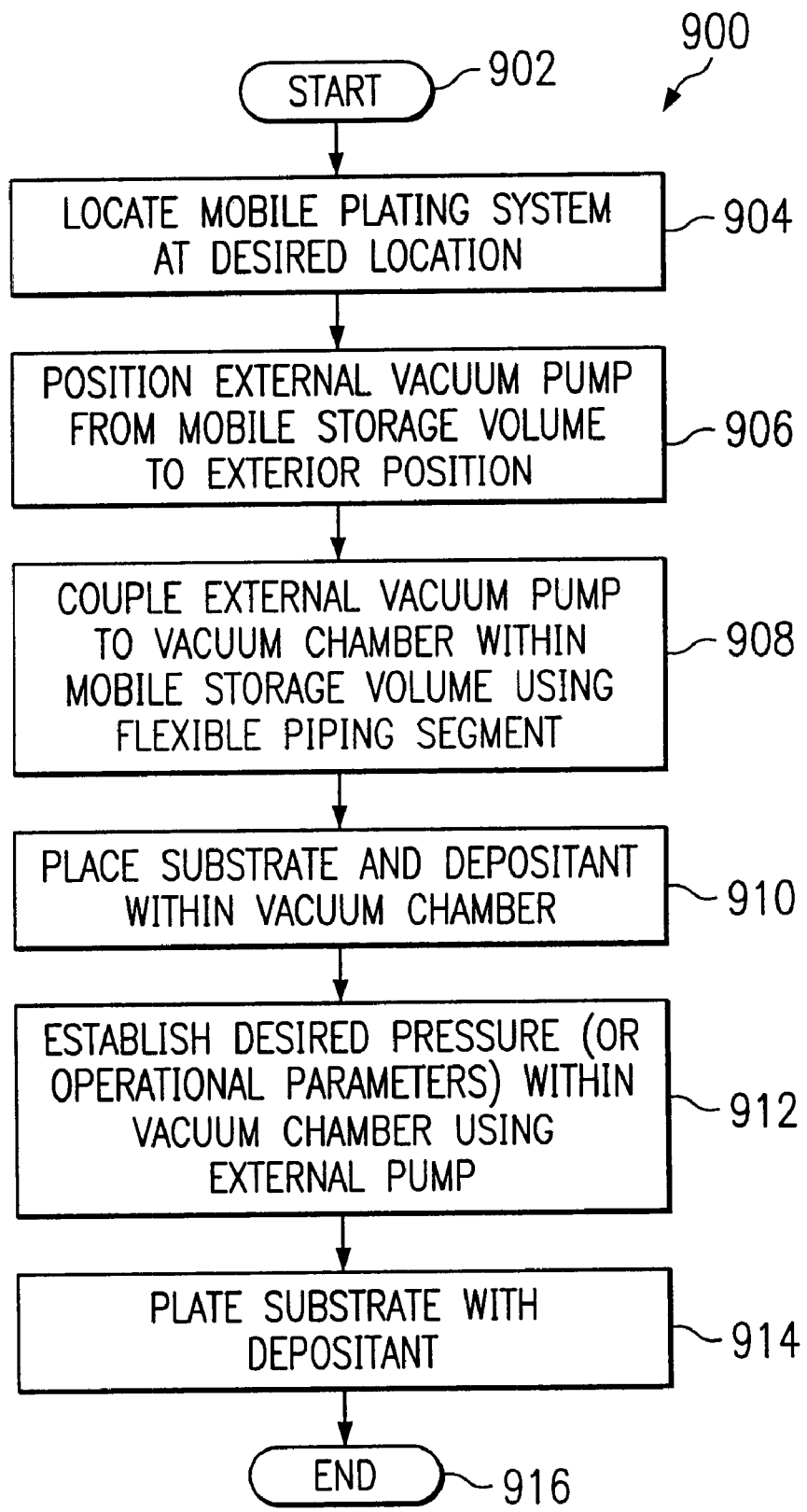
FIG. 9 is a flowchart that illustrates a method for using a mobile plating system according to one embodiment of the present invention.

FIG. 9 is flow chart that illustrates a method 900 for using the mobile plating system 700 according to one embodiment of the present invention. The method 900 begins at block 902 and proceeds to block 904. At block 904, the mobile plating system is located or positioned at a desired location. For example, in the event that the mobile plating system is used at a nuclear power plant, the mobile plating system will be located at or near the nuclear power plant site so that any critical parts or components that need to be coated or plated may be conveniently and easily transported without the fear of any lost shipments or delays in shipping. At block 906, the external vacuum pump is removed from the interior or from within the mobile storage volume of the mobile plating system and located or positioned external the mobile storage volume. This provides the considerable and significant advantage of eliminating a tremendous source of mechanical noise and vibration which can interfere with the plating process.

The method 900 proceeds next to block 908 where the external vacuum pump is coupled to the vacuum chamber using the flexible piping segments. As just discussed above, this also further isolates the external vacuum pump and eliminates potential failures or breakdowns due to mechanical stresses, cracks, and leaks. Proceeding next to block 910, a substrate, such as a reactor vessel head stud, may be positioned within the vacuum chamber along with a depositant. As was discussed in connection with FIG. 7, in the event that the substrate is a large or bulky component, the present invention provides the significant advantage of allowing such substrates to be conveniently handled using the trolley/hoist, which can extend outside of the mobile storage volume of the mobile plating system. The substrate can then be positioned precisely as desired on a platform or table which can then be slid or positioned within the vacuum chamber.

The method 900 proceeds next to block 912 where the plating process begins. This will generally include establishing a desired pressure or pressures within the vacuum chamber and establishing desired operational parameters within the vacuum chamber. Finally, the method 900 proceeds to block 914 where the substrate is plated with a depositant using virtually any known or available plating or deposition technology such as vacuum deposition, plasma plating, physical vapor deposition, chemical vapor deposition, ion plating, sputtering, and ion implantation. Finally, the method 900 ends at block 916.

Thus, it is apparent that there has been provided, in accordance with the present invention, a mobile plating system and method that satisfies one or more of the advantages set forth above. Although the preferred embodiment has been described in detail, it should be understood that various changes, substitutions, and alterations can be made herein without departing from the scope of the present invention, even if all, one, or some of the advantages identified above are not present. For example, the vacuum chamber and the external vacuum pump may be coupled using one or more flexible piping segments or joints, and may be coupled through an internal vacuum pump, such as, for example, a diffusion vacuum pump, cryo pump and/or a turbo molecular pump. The present invention may be implemented using any of a variety of materials and configurations. For example, any of a variety of vacuum pump systems, equipment, and technology could be used in the present invention. These are only a few of the examples of other arrangements or configurations of the mobile plating system and method that is contemplated and covered by the present invention.

The various components, equipment, substances, elements, and processes described and illustrated in the preferred embodiment as discrete or separate may be combined or integrated with other elements and processes without departing from the scope of the present invention. For example, one of more pumps may be coupled or integrated to assist with providing or maintaining a designated pressure or vacuum condition in a vacuum chamber. Other examples of changes, substitutions, and alterations are readily ascertainable by one skilled in the art and could be made without departing from the spirit and scope of the present invention.

What is claimed is:

1. A mobile plating system for performing a plating process, the mobile plating system comprising:
    a mobile storage volume;
    a vacuum chamber positioned in the mobile storage volume the vacuum chamber having an internal volume large enough to contain at least one reactor vessel head stud;
    an external vacuum pump operable to be positioned within the mobile storage volume when the mobile plating system is in transit, and to operate external the mobile storage volume when the mobile plating system is stationary and in operation, the external vacuum pump operable to couple with the vacuum chamber through a flexible piping segment to assist with producing a desired pressure in the vacuum chamber when the mobile plating system is stationary and in operation;
    an internal vacuum pump operable to couple with the vacuum chamber to assist with producing the desired pressure in the vacuum chamber;
    a control module operable to control the external vacuum pump;
    a platform operable to be positioned within the vacuum chamber and to support a substrate to be plated;
    a filament operable to hold a depositant within the vacuum chamber in relation to the platform; and
    an associated equipment that includes:
        a dc power supply operable to generate a desired voltage at the substrate,
        an rf transmitter operable to generate an rf signal at a desired power level at the substrate, and
        a filament power control module operable to generate a current at a desired level at the filament.

2. The mobile plating system of claim 1, wherein the mobile storage volume is a trailer.

3. The mobile plating system of claim 1, wherein the mobile storage volume is a cargo box.

4. The mobile plating system of claim 3, wherein the cargo box is a SEA/LAND cargo box.

5. The mobile plating system of claim 1, wherein the mobile storage volume is a cargo volume of a truck.

6. The mobile plating system of claim 1, wherein the external vacuum pump is mounted on a skid.

7. The mobile plating system of claim 1, wherein the external vacuum pump is a mechanical pump.

8. The mobile plating system of claim 1, wherein the external vacuum pump includes a roughing pump and a foreline pump.

9. The mobile plating system of claim 8, wherein the roughing pump is a mechanical pump that couples with the vacuum chamber using a first flexible piping segment, and the foreline pump is a mechanical pump that couples with the vacuum chamber through a second flexible piping segment.

10. The mobile plating system of claim 8, wherein the roughing pump and the foreline pump are mounted on a skid.

11. The mobile plating system of claim 1, wherein the control module is operable to control the internal vacuum pump.

12. The mobile plating system of claim 1, wherein the external vacuum pump includes a roughing pump and a foreline pump, the roughing pump couples with the vacuum chamber using a first flexible piping segment, and the foreline pump couples with the vacuum chamber through a second flexible piping segment and the internal vacuum pump.

13. The mobile plating system of claim 1, wherein the internal vacuum pump is a diffusion pump.

14. The mobile plating system of claim 1, further comprising:
    a cooling system operable to cool the internal vacuum pump.

15. The mobile plating system of claim 14, wherein the cooling system is a water cooling system that includes:
    a chiller operable to generate chilled water and to supply the chilled water to the internal vacuum pump for cooling; and
    a water tank operable to receive and store the warmed water from the internal vacuum pump and to supply such water to the chiller.

16. The mobile plating system of claim 1, wherein the control module is operable to control the dc power supply, the rf transmitter, and the filament power control module.

17. The mobile plating system of claim 16, wherein the platform is a turntable and further comprising:
    a motor operable to control the rotation of the turntable, and wherein the control module is operable to control the motor.

18. The mobile plating system of claim 17, further comprising:
- a movable cart operable to support the platform and to transport the platform to and from the vacuum chamber.

19. The mobile plating system of claim 18, wherein the movable cart operates on tracks.

20. The mobile plating system of claim 17, further comprising:
- a bead blast cabinet operable to clean a substrate before plating.

21. The mobile plating system of claim 1, further comprising:
- a platform operable to be positioned within the vacuum chamber and to support a substrate to be plated; and
- a trolley/hoist operable to lift and transport a substrate to the platform.

22. The mobile plating system of claim 21, further comprising:
- railing extensions operable to allow the trolley/hoist to move outside of the mobile storage volume to lift and transport a substrate to the platform within the mobile storage volume.

23. The mobile plating system of claim 1, wherein the plating process is plasma plating.

24. The mobile plating system of claim 1, wherein the plating process uses vacuum deposition.

25. The mobile plating system of claim 1, wherein the plating process is physical vapor deposition.

26. The mobile plating system of claim 1, wherein the plating process is chemical vapor deposition.

27. The mobile plating system of claim 1, wherein the plating process uses sputtering.

28. The mobile plating system of claim 1, wherein the plating process uses ion plating.

29. The mobile plating system of claim 1, wherein the plating process uses ion implantation.

30. A mobile plating system for performing a plating process, the mobile plating system comprising:
- a mobile storage volume;
- a vacuum chamber positioned in the mobile storage volume, the vacuum chamber having an internal volume large enough to contain at least one reactor vessel head stud;
- an external vacuum pump operable to be positioned within the mobile storage volume when the mobile storage volume is in transit, and to operate external the mobile storage volume when the mobile plating system is stationary and in operation, the external vacuum pump operable to couple with the vacuum chamber through a flexible piping segment to assist with producing a desired pressure in the vacuum chamber when the mobile plating system is stationary and in operation;
- an internal vacuum pump operable to couple with the vacuum chamber to assist with producing the desired pressure in the vacuum chamber;
- a cooling system operable to cool the internal vacuum pump;
- a platform operable to be positioned within the vacuum chamber and to support a substrate to be plated;
- a filament operable to hold a depositant within the vacuum chamber in relation to the platform; and
- an associated equipment that includes:
  - a dc power supply operable to generate a desired voltage at the substrate;
  - an rf transmitter operable to generate an rf signal at a desired power level at the substrate; and
  - a filament power control operable to generate a current at a desired level at the filament; and
  - a control circuitry operable to control the external vacuum pump, the internal vacuum pump, the dc power supply, the rf transmitter, and the filament power control module.

31. The mobile plating system of claim 30, wherein the control circuitry is integrated into one control module.

32. The mobile plating system of claim 30, wherein the control circuitry includes a plurality of control modules.

* * * * *